(12) United States Patent
Kim et al.

(10) Patent No.: US 9,983,476 B2
(45) Date of Patent: May 29, 2018

(54) RESIN COMPOSITION INCLUDING NOVEL POLYMER AND ORGANIC FILM USING THE SAME

(71) Applicant: Samsung SDI Co., Ltd., Yongin-si (KR)

(72) Inventors: Sang Soo Kim, Suwon-si (KR); Jin Hee Kang, Suwon-si (KR); Hee Kyoung Kang, Suwon-si (KR); Chan Woo Kim, Suwon-si (KR); Bum Jin Lee, Suwon-si (KR); Sung Seo Cho, Suwon-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 0 days. days.

(21) Appl. No.: 15/171,046

(22) Filed: Jun. 2, 2016

(65) Prior Publication Data
US 2017/0139323 A1   May 18, 2017

(30) Foreign Application Priority Data
Nov. 12, 2015 (KR) ........................ 10-2015-0159103

(51) Int. Cl.
*G03F 7/039* (2006.01)
*G03F 7/022* (2006.01)
(Continued)

(52) U.S. Cl.
CPC ............... *G03F 7/039* (2013.01); *C08K 3/04* (2013.01); *C08K 5/3445* (2013.01);
(Continued)

(58) Field of Classification Search
None
See application file for complete search history.

(56) References Cited

U.S. PATENT DOCUMENTS 4,632,900 A   12/1986 Demmer et al.
4,642,282 A * 2/1987 Stahlhofen ............. C08G 61/00
430/165
(Continued)

FOREIGN PATENT DOCUMENTS

EP   1738921 A1   1/2007
JP   06-230215   *   8/1994
(Continued)

OTHER PUBLICATIONS

Pyriadi et al., Preparation of phenol formaldehyde resins containing pendant isoimides and their isomerization to stable resins., J Poly. Sci., Pt A., Poly. Chem., vol. 38 3244-3252 (2000).*
(Continued)

*Primary Examiner* — Martin J Angebranndt
(74) *Attorney, Agent, or Firm* — Additon, Higgins & Pendleton, P.A.

(57) ABSTRACT

A resin composition includes a polymer including a repeating unit represented by Chemical Formula 1, wherein in Chemical Formula 1, each substituent is the same as defined in the specification, and a solvent and an organic film manufactured using the same is provided.

[Chemical Formula 1]

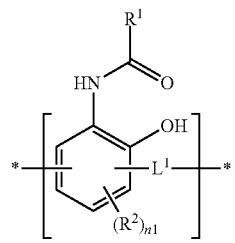

10 Claims, 1 Drawing Sheet

(51) Int. Cl.
*G03F 7/038* (2006.01)
*C08L 61/06* (2006.01)
*C08L 61/14* (2006.01)
*C08K 3/04* (2006.01)
*C08K 5/3445* (2006.01)
*C08K 5/3492* (2006.01)
*C08L 75/12* (2006.01)
*G03F 7/004* (2006.01)
*G03F 7/023* (2006.01)

(52) U.S. Cl.
CPC ............ *C08K 5/3492* (2013.01); *C08L 61/06* (2013.01); *C08L 61/14* (2013.01); *C08L 75/12* (2013.01); *G03F 7/0045* (2013.01); *G03F 7/0226* (2013.01); *G03F 7/0236* (2013.01); *G03F 7/0382* (2013.01); *C08L 2201/56* (2013.01)

(56) References Cited

U.S. PATENT DOCUMENTS

| | | | |
|---|---|---|---|
| 5,652,081 A | 7/1997 | Tan et al. | |
| 5,985,507 A | 11/1999 | Blakeney et al. | |
| 2008/0153031 A1* | 6/2008 | Echigo | G03F 7/0382 430/281.1 |
| 2011/0008730 A1* | 1/2011 | Hanamura | C08G 77/12 430/270.1 |
| 2013/0149645 A1* | 6/2013 | Takemura | G03F 7/0757 430/280.1 |
| 2014/0186768 A1* | 7/2014 | Kwon | G03F 7/0755 430/281.1 |
| 2016/0326396 A1 | 11/2016 | Nishimaki et al. | |

FOREIGN PATENT DOCUMENTS

| | | | |
|---|---|---|---|
| JP | 09-005994 | * | 1/1997 |
| JP | 2899776 B2 | | 6/1999 |
| JP | 3596855 B2 | | 12/2004 |
| JP | 2010-033027 | * | 2/2010 |
| JP | 2010-039270 | * | 2/2010 |
| JP | 4738913 B2 | | 8/2011 |
| KR | 10-2001-0041086 | | 5/2001 |
| KR | 10-0384186 | | 5/2004 |
| SU | 1209697 | * | 2/1986 |
| TW | 201538609 A | | 10/2015 |

OTHER PUBLICATIONS

Search Report in counterpart Taiwanese Application No. 105117784 dated Apr. 19, 2017, pp. 1.

* cited by examiner

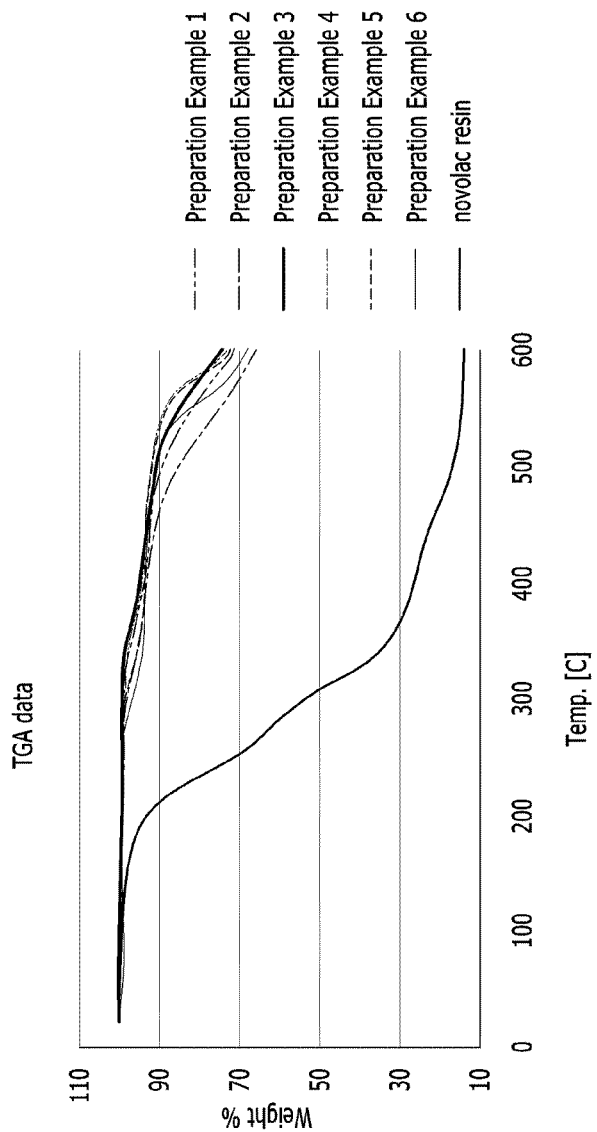

RESIN COMPOSITION INCLUDING NOVEL POLYMER AND ORGANIC FILM USING THE SAME

CROSS-REFERENCE TO RELATED APPLICATION

This application claims priority to and the benefit of Korean Patent Application No. 10-2015-0159103 filed in the Korean Intellectual Property Office on Nov. 12, 2015, the entire disclosure of which is incorporated herein by reference.

FIELD

This disclosure relates to a resin composition including a novel polymer and an organic film using the same.

BACKGROUND

An organic film used as a protective layer of a semiconductor device, an interlayer insulating layer, a display insulation layer, and the like may be manufactured with fewer process steps by using a composition having pattern forming capability. For example, a positive-type material can be chemically changed in a region receiving light through UV exposure and developed in an alkali solution to make an organic film. Then, the organic film may be cured.

Conventional positive-type materials for forming an organic film include polybenzoxazole, polyimide and silicon-based polymer materials. Organic films made using the same, however, can have problems such as deteriorated pattern formability, stability, and the like.

Accordingly, there is a need for a polymer for making an organic film having excellent pattern formability, stability, and the like.

SUMMARY OF THE INVENTION

One embodiment provides a resin composition that can have excellent sensitivity and pattern-forming capability due to a novel polymer having improved thermal characteristics.

Another embodiment provides an organic film manufactured using the resin composition.

One embodiment provides a resin composition including a polymer including a repeating unit represented by Chemical Formula 1 and a solvent:

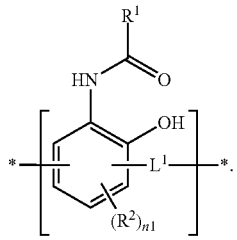

[Chemical Formula 1]

In Chemical Formula 1,
$R^1$ is a substituted or unsubstituted C1 to C20 alkoxy group, a substituted or unsubstituted C3 to C20 cycloalkyl group, a substituted or unsubstituted C6 to C20 aryl group, or a substituted or unsubstituted C2 to C20 heteroaryl group, $R^2$ is a halogen atom, a hydroxy group, an amino group, a nitro group, a substituted or unsubstituted C1 to C20 alkyl group, or a substituted or unsubstituted C6 to C20 aryl group, $L^1$ is a single bond, a substituted or unsubstituted C1 to C20 alkylene group, a substituted or unsubstituted C6 to C20 arylene group, a substituted or unsubstituted C2 to C20 heteroarylene group, or a combination thereof, and $n1$ is an integer ranging from 0 to 2.

$R^1$ may be a substituted or unsubstituted C1 to C20 alkoxy group or a substituted or unsubstituted C6 to C20 aryl group.

$R^2$ may be a C1 to C20 alkyl group substituted with a hydroxy group.

$L^1$ may be selected from one or more of Chemical Formulae 2 to 4:

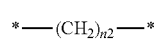

[Chemical Formula 2]

[Chemical Formula 3]

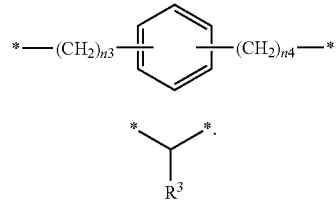

[Chemical Formula 4]

In Chemical Formulae 2 to 4,
$n2$ is an integer ranging from 1 to 10,
$n3$ and $n4$ are the same or different and are each independently integers ranging from 1 to 7, and
$R^3$ is a substituted or unsubstituted C3 to C20 cycloalkyl group or a substituted or unsubstituted C6 to C20 aryl group.

The solvent may include two or more organic solvents having different boiling points.

The solvent may be included in an amount of about 130 parts by weight to about 2,000 parts by weight based on about 100 parts by weight of the polymer.

The resin composition may further include a diazoquinone compound, a thermal acid generator, a photoacid generator, or a combination thereof.

The resin composition may further include a cross-linking agent.

The cross-linking agent may be represented by one or more of Chemical Formulae 5 to 7:

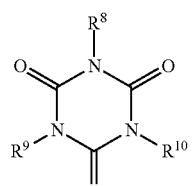

[Chemical Formula 5]

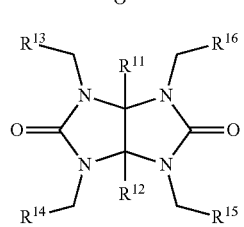

[Chemical Formula 6]

[Chemical Formula 7]

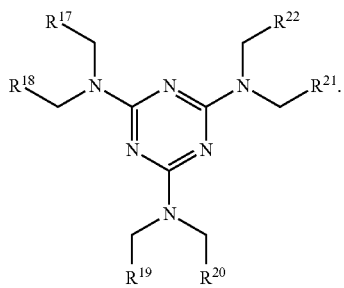

In Chemical Formula 5 to 7, $R^8$ to $R^{10}$ are the same or different and are each independently a hydrogen atom, a substituted or unsubstituted C1 to C10 alkyl group or a substituted or unsubstituted C1 to C10 alkoxy group, $R^{11}$ and $R^{12}$ are the same or different and are each independently a hydrogen atom or a substituted or unsubstituted C1 to C10 alkyl group, and $R^{13}$ to $R^{22}$ are the same or different and are each independently a hydrogen atom, a hydroxy group, a substituted or unsubstituted C1 to C10 alkyl group, or a substituted or unsubstituted C1 to C10 alkoxy group.

The cross-linking agent may be included in an amount of about 1 part by weight to about 60 parts by weight based on about 100 parts by weight of the polymer.

The resin composition may further include a black pigment.

The black pigment may include an aniline black, a perylene black, a titanium black, a cyanine black, a lignin black, a lactam-based organic black, a RGB black, a carbon black, or a combination thereof.

The resin composition may further include an additive of malonic acid, 3-amino-1,2-propanediol, a leveling agent, a surfactant, a radical polymerization initiator, or a combination thereof.

Another embodiment provides an organic film manufactured using the resin composition.

Other embodiments of the present invention are included in the following detailed description.

The polymer according to one embodiment can have excellent thermal characteristics, and thus a resin composition including the polymer may provide an organic film easily adjusting a taper angle and having excellent sensitivity.

BRIEF DESCRIPTION OF THE DRAWINGS

FIG. 1 is a graph showing weight loss of polymers according to Preparation Examples 1 to 6 and Comparative Examples 1 and 2 as a function of temperature.

DETAILED DESCRIPTION

The present invention will be described more fully hereinafter with reference to the accompanying drawing, in which exemplary embodiments of the present invention are shown. This invention may, however, be embodied in many different forms and should not be construed as limited to the exemplary embodiments set forth herein. These exemplary embodiments disclosed in this specification are provided so that this disclosure will satisfy applicable legal requirements.

As used herein, when a specific definition is not otherwise provided, the term "alkyl group" refers to a C1 to C20 alkyl group, the term "alkenyl group" refers to a C2 to C20 alkenyl group, the term "cycloalkenyl group" refers to a C3 to C20 cycloalkenyl group, the term "heterocycloalkenyl group" refers to a C3 to C20 heterocycloalkenyl group, the term "aryl group" refers to a C6 to C20 aryl group, the term "arylalkyl group" refers to a C6 to C20 arylalkyl group, the term "alkylene group" refers to a C1 to C20 alkylene group, the term "arylene group" refers to a C6 to C20 arylene group, the term "alkylarylene group" refers to a C6 to C20 alkylarylene group, the term "heteroarylene group" refers to a C3 to C20 heteroarylene group, and the term "alkoxylene group" refers to a C1 to C20 alkoxylene group.

As used herein, when a specific definition is not otherwise provided, the term "substituted" refers to one substituted with a substituent selected from a halogen atom (F, Cl, Br, I), a hydroxy group, a C1 to C20 alkoxy group, a nitro group, a cyano group, an amine group, an imino group, an azido group, an amidino group, a hydrazino group, a hydrazono group, a carbonyl group, a carbamyl group, a thiol group, an ester group (e.g., *—O(C═O)CH₃ etc.), an ether group, a carboxyl group or a salt thereof, a sulfonic acid group or a salt thereof, a phosphoric acid or a salt thereof, a C1 to C20 alkyl group, a C2 to C20 alkenyl group, a C2 to C20 alkynyl group, a C6 to C20 aryl group, a C3 to C20 cycloalkyl group, a C3 to C20 cycloalkenyl group, a C3 to C20 cycloalkynyl group, a C2 to C20 heterocycloalkyl group, a C2 to C20 heterocycloalkenyl group, a C2 to C20 heterocycloalkynyl group, a C3 to C20 heteroaryl group, or a combination thereof, instead of at least one hydrogen.

As used herein, when a specific definition is not otherwise provided, the term "organic group" can include a C1 to C40 aliphatic organic group, a C3 to C40 alicyclic organic group and/or a C6 to C40 aromatic organic group. Also as used herein, unless other specified, the term "aliphatic organic group" may refer to a C1 to C40 alkyl group, a C2 to C40 alkenyl group, a C2 to C40 alkynyl group, a C1 to C40 alkylene group, a C2 to C40 alkenylene group, or a C2 to C40 alkynylene group, for example a C1 to C20 alkyl group, a C2 to C20 alkenyl group, a C2 to C20 alkynyl group, a C1 to C20 alkylene group, a C2 to C20 alkenylene group, or a C2 to C20 alkynylene group; the term "alicyclic organic group" may refer to a C3 to C40 cycloalkyl group, a C3 to C40 cycloalkenyl group, a C3 to C40 cycloalkynyl group, a C3 to C40 cycloalkylene group, a C3 to C40 cycloalkenylene group, or a C3 to C40 cycloalkynylene group, for example a C3 to C20 cycloalkyl group, a C3 to C20 cycloalkenyl group, a C3 to C20 cycloalkynylgroup, a C3 to C20 cycloalkylenegroup, a C3 to C20 cycloalkenylene group, or a C3 to C20 cycloalkynylene group; and the term "aromatic organic group" may refer to a C6 to C40 aryl group, a C2 to C40 heteroaryl group, a C6 to C40 arylene group, or a C2 to C40 heteroarylene group, for example a C6 to C16 aryl group, a C2 to C16 heteroaryl group, a C6 to C16 arylene group, or a C2 to C16 heteroarylene group.

As used herein, when a specific definition is not otherwise provided, the term "hetero" refers to at least one heteroatom selected from N, O, S, and/or P in chemical formulae.

As used herein, when a specific definition is not otherwise provided, "(meth)acrylate" refers to both "acrylate" and "methacrylate", and "(meth)acrylic acid" refers to "acrylic acid" and "methacrylic acid".

As used herein, when a specific definition is not otherwise provided, the term "combination" refers to mixing and/or copolymerization.

As used herein, unless a specific definition is otherwise provided, a hydrogen atom is bonded at the position when a chemical bond is not drawn where a bond would otherwise appear.

As used herein, when a specific definition is not otherwise provided, "*" indicates a point where the same or different atom or chemical formula is linked.

A resin composition according to one embodiment includes a polymer including a repeating unit represented by Chemical Formula 1 and a solvent.

Hereinafter, each component according to one embodiment is described in detail.

Polymer

One embodiment provides a resin composition comprising a polymer including a repeating unit represented by Chemical Formula 1:

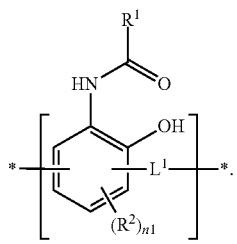

[Chemical Formula 1]

In Chemical Formula 1, $R^1$ is a substituted or unsubstituted C1 to C20 alkoxy group, a substituted or unsubstituted C3 to C20 cycloalkyl group, a substituted or unsubstituted C6 to C20 aryl group, or a substituted or unsubstituted C2 to C20 heteroaryl group $R^2$ is a halogen atom, a hydroxy group, an amino group, a nitro group, a substituted or unsubstituted C1 to C20 alkyl group, or a substituted or unsubstituted C6 to C20 aryl group, $L^1$ is a single bond, a substituted or unsubstituted C1 to C20 alkylene group, a substituted or unsubstituted C6 to C20 arylene group, a substituted or unsubstituted C2 to C20 heteroarylene group, or a combination thereof, and n1 is an integer ranging from 0 to 2.

A polymer according to one embodiment can have improved thermal characteristics due to the repeating unit represented by Chemical Formula 1.

$R^1$ may be a substituted or unsubstituted C1 to C20 alkoxy group or a substituted or unsubstituted C6 to C20 aryl group.

$R^2$ may be a C1 to C20 alkyl group substituted with a hydroxy group.

$L^1$ may be selected from one or more of Chemical Formulae 2 to 4:

[Chemical Formula 2]

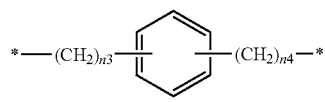

[Chemical Formula 3]

[Chemical Formula 4]

In Chemical Formulae 2 to 4, n2 is an integer ranging from 1 to 10, n3 and n4 are the same or different and are each independently integers ranging from 1 to 7, and $R^3$ is a substituted or unsubstituted C3 to C20 cycloalkyl group or a substituted or unsubstituted C6 to C20 aryl group.

When $R^1$ is a substituted or unsubstituted C1 to C20 alkoxy group or a substituted or unsubstituted C6 to C20 aryl group, and/or when $L^1$ is one selected from Chemical Formulae 2 to 4, the polymer may have more excellent thermal characteristics.

The polymer may have a thermally polymerizable functional group derived from a reactive end-capping monomer at either one terminal end or both terminal ends. Examples of the reactive end-capping monomer may include without limitation monoamines having a carbon-carbon double bond, monoanhydrides having a carbon-carbon double bond, and the like, and combinations thereof. Examples of the monoamines may include without limitation toluidine, dimethylaniline, ethylaniline, aminophenol, aminobenzylalcohol, aminoindan, aminoacetone phenone, and the like, and combinations thereof.

The resin composition including the polymer may maintain a taper angle of about 20° to about 60°, for example about 25° to about 55°, for example about 30° to about 55°, for example about 35° to about 55°, and thus can improve taper characteristics.

The polymer including the repeating unit represented by Chemical Formula 1 may have a weight average molecular weight of about 3,000 g/mol to about 300,000 g/mol, for example about 3,000 g/mol to about 100,000 g/mol, for example about 3,000 g/mol to about 30,000 g/mol, for example about 3,000 g/mol to about 20,000 g/mol. When the polymer according to one embodiment has a weight average molecular weight within the above ranges, for example, in a range of about 3,000 g/mol to about 20,000 g/mol, excellent thermal characteristics and a sufficient film residue ratio in a non-exposed region during the development with an alkali aqueous solution can be obtained, and sensitivity and chemical resistance may be effectively improved. On the other hand, when the polymer has a weight average molecular weight of less than about 3,000 g/mol, the polymer may not be an appropriate material for forming an organic film.

The resin composition according to one embodiment may further include one or more other polymers that are not the same as the polymer including the repeating unit represented by Chemical Formula 1. Examples of the other polymer(s) include without limitation hydroxy styrene resins, novolac resins, bisphenol A resins, bisphenol F resins, acrylate resins, silanol group-containing resins, silsesquioxane resins, polyhydroxyamide resins, polyamic acid resins, and the like, and combinations thereof.

Solvent

The photosensitive resin composition includes a solvent capable of easily dissolving each post-described component, for example a diazoquinone compound, a photoacid generator, a thermal acid generator, a cross-linking agent, and the like as well as the polymer.

The solvent may be an organic solvent. Examples of the solvent may include without limitation N-methyl-2-pyrrolidone, gamma-butyrolactone, N,N-dimethyl acetamide, dimethylsulfoxide, diethylene glycoldimethylether, diethylene glycoldiethylether, diethylene glycoldibutylether, ethylene glycoldimethylether, propylene glycolmonomethylether, dipropylene glycolmonomethylether, propylene glycolmonomethyl ether acetate, methyl lactate, ethyl lactate, butyl lactate, methyl-1,3-butylene glycolacetate, 1,3-butylene glycol-3-monomethylether, methyl pyruvate, ethyl pyruvate, methyl-3-methoxy propionate, benzylalcohol, and the like, and combinations thereof.

The solvent may be selected appropriately depending on a process of forming a photosensitive resin film such as spin coating, slit die coating, and the like.

The solvent may include two or more organic solvents having different boiling points, for example a first organic solvent and a second organic solvent.

In exemplary embodiments, a difference between the boiling point of the first organic solvent and the boiling point of the second organic solvent may be greater than or equal to about 20° C. When two or more organic solvents are used and the difference between the boiling points of the two or more organic solvents is greater than or equal to about 20° C., the resin composition may be more uniformly coated on a substrate.

The resin compositions can include the solvent in an amount of about 130 parts by weight to about 2,000 parts by weight, for example about 200 parts by weight to about 1,800 parts by weight, for example about 200 parts by weight to about 1,500 parts by weight, based on about 100 parts by weight of the polymer. When the solvent is used in an amount within the above ranges, a film having a sufficient thickness may be obtained, and solubility and coating properties may be improved.

A resin composition according to another embodiment can further include a diazoquinone compound, a thermal acid generator, a photoacid generator, a cross-linking agent, a black pigment, other additive(s), or a combination of two or more thereof in addition to the polymer and the solvent.

Hereinafter, a resin composition according to another embodiment is described in detail.

Diazoquinone Compound

The diazoquinone compound may be a compound having a 1,2-benzoquinonediazide structure and/or a 1,2-naphthoquinonediazide structure.

Examples of the diazoquinone compound may include without limitation one or more compounds represented by Chemical Formula 16 and Chemical Formulae 18 to 20.

[Chemical Formula 16]

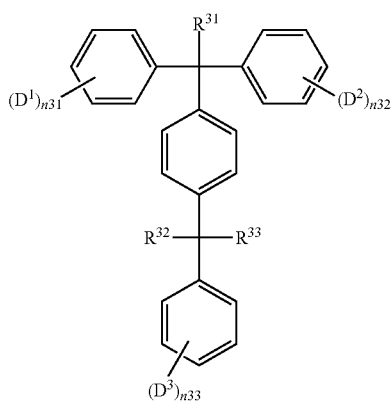

In Chemical Formula 16,
$R^{31}$ to $R^{33}$ are the same or different and are each independently a hydrogen atom or a substituted or unsubstituted alkyl group, for example $CH_3$,
$D_1$ to $D_3$ are the same or different and are each independently OQ, wherein the Q is a hydrogen atom or a functional group represented by Chemical Formula 17a or Chemical Formula 17b, provided that all Qs are not simultaneously a hydrogen atom, and
n31 to n33 are the same or different and are each independently integers of 1 to 5.

[Chemical Formula 17a]

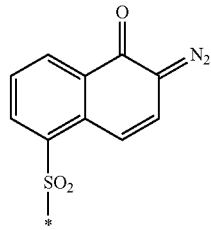

[Chemical Formula 17b]

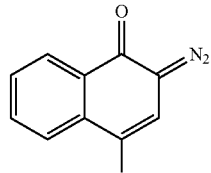

[Chemical Formula 18]

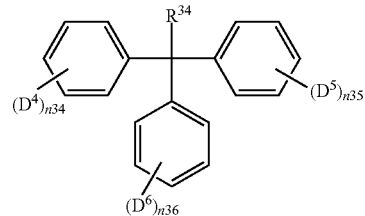

In Chemical Formula 18,
$R^{34}$ is a hydrogen atom or a substituted or unsubstituted alkyl group,
$D^4$ to $D^6$ are the same or different and are each independently OQ, wherein Q is the same as defined in Chemical Formula 16, and
n34 to n36 are the same or different and are each independently integers of 1 to 5.

[Chemical Formula 19]

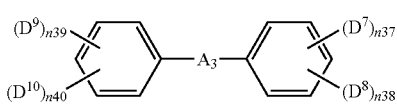

In Chemical Formula 19,
$A_3$ is CO or $CR^{500}R^{501}$, wherein $R^{500}$ and $R^{501}$ are the same or different and are each independently a substituted or unsubstituted alkyl group,
$D^7$ to $D^{10}$ are the same or different and are each independently a hydrogen atom, a substituted or unsubstituted alkyl group, OQ or NHQ, wherein Q is the same as defined in Chemical Formula 16,
n37, n38, n39 and n40 are the same or different and are each independently integers of 1 to 4,
n37+n38 and n39+n40 are the same or different and are each independently integers of less than or equal to 5,
wherein at least one of the $D^7$ to $D^{10}$ is OQ, and one aromatic ring includes one to three OQs and the other aromatic ring includes one to four OQs.

[Chemical Formula 20]

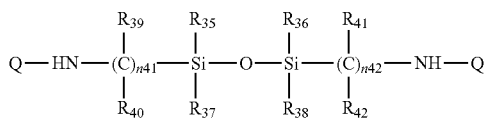

In Chemical Formula 20, $R_{35}$ to $R_{42}$ are the same or different and are each independently a hydrogen atom or a substituted or unsubstituted alkyl group, n41 and n42 are the same or different and are each independently integers of 1 to 5, for example 2 to 4, and Q is the same as defined in Chemical Formula 16.

The resin composition can include the diazoquinone compound in an amount of about 5 parts by weight to about 100 parts by weight, for example about 10 parts by weight to about 80 parts by weight, for example about 10 parts by weight to about 50 parts by weight, based on about 100 parts by weight of the polymer. In some embodiments, the resin composition can include the diazoquinone compound in an amount of about 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, 99, or 100 parts by weight. Further, according to some embodiments of the present invention, the amount of the diazoquinone compound can be in a range from about any of the foregoing amounts to about any other of the foregoing amounts.

When the diazoquinone compound is included in an amount within the above range, the pattern can be well-formed with minimal or no residue from exposure, and a film thickness loss during development may be prevented and thereby a good pattern can be provided.

Photoacid Generator

The resin composition may include a photoacid generator (PAG) instead of the diazoquinone compound. In addition, the resin composition may further include the photoacid generator in addition to the diazoquinone compound.

Examples of the photoacid generator may include one or more represented by Chemical Formula 10 to 11.

[Chemical Formula 10]

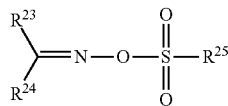

[Chemical Formula 11]

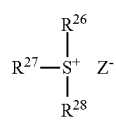

In Chemical Formulae 10 and 11, $R^{23}$, $R^{24}$ and $R^{26}$ to $R^{28}$ are the same or different and are each independently a hydrogen atom or a substituted or unsubstituted C1 to C40 organic group, $R^{25}$ is a substituted or unsubstituted C1 to C20 alkyl group, a substituted or unsubstituted C2 to C20 alkenyl group, a substituted or unsubstituted C3 to C20 cycloalkyl group, a substituted or unsubstituted C6 to C20 aryl group, or a combination thereof, and $Z^-$ is an anion of an organic acid.

$R^{23}$ and $R^{24}$ may be linked to each other to form a ring.

$R^{26}$ and $R^{27}$ may be linked to each other to form a ring.

$Z^-$ may be a fluoro group (—F).

$Z^-$ may be at least one selected from nitrogen, carbon and a sulfonyl group.

Chemical Formula 10 may be represented by one or more of Chemical Formulae 10-1 to 10-3.

[Chemical Formula 10-1]

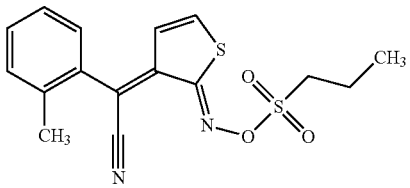

[Chemical Formula 10-2]

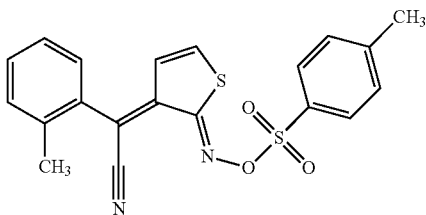

[Chemical Formula 10-3]

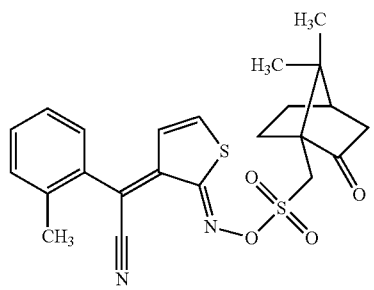

Chemical Formula 11 may be represented by one or more of Chemical Formulae 11-1 to 11-7.

[Chemical Formula 11-1]

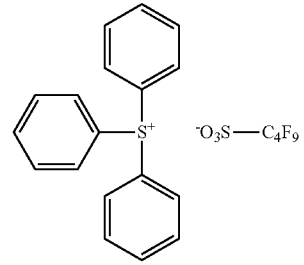

[Chemical Formula 11-2]
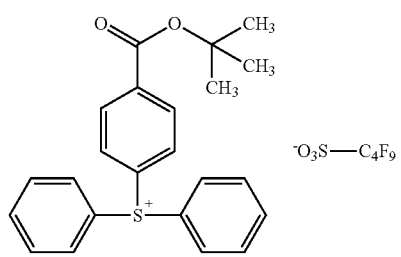

[Chemical Formula 11-3]
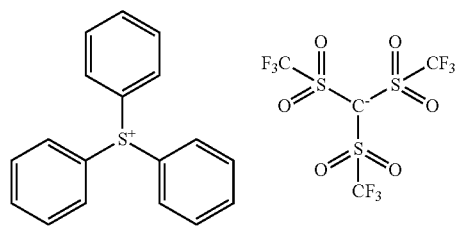

[Chemical Formula 11-4]
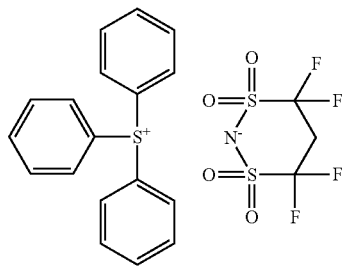

[Chemical Formula 11-5]
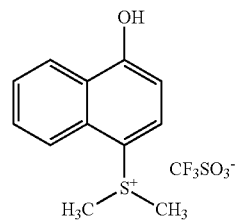

[Chemical Formula 11-6]
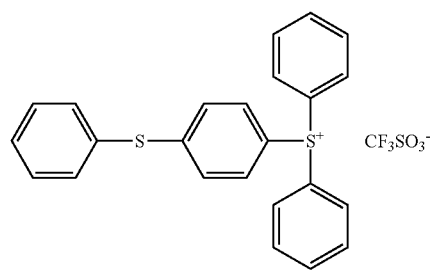

[Chemical Formula 11-7]
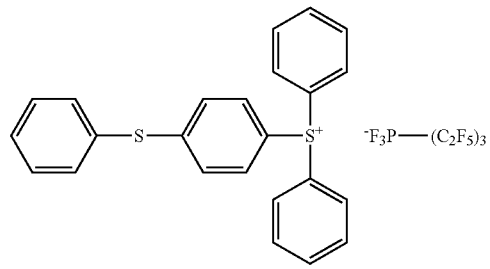

The resin composition can include the photoacid generator in an amount of about 0.1 part by weight to about 20 parts by weight, for example about 0.5 parts by weight to about 15 parts by weight, for example about 3 parts by weight to about 10 parts by weight, based on about 100 parts by weight of the polymer. In some embodiments, the resin composition can include the photoacid generator in an amount of about 0.1, 0.2, 0.3, 0.4, 0.5, 0.6, 0.7, 0.8, 0.9, 1, 2, 3, 4, 5, 6, 7, 8, 9, 10, 11, 12, 13, 14, 15, 16, 17, 18, 19, or 20 parts by weight. Further, according to some embodiments of the present invention, the amount of the photoacid generator can be in a range from about any of the foregoing amounts to about any other of the foregoing amounts.

When the photoacid generator is included in an amount within the above range, development of the resin composition at the exposed region may be easily performed.

Thermal Acid Generator

The resin composition may further include a thermal acid generator.

A thermal acid generator used in the present invention is thermally decomposed and generates acid and may be any conventional thermal acid generator, for example, a thermal acid generator having a thermal decomposition temperature of about 120° C. to about 250° C.

When the thermal acid generator has a thermal decomposition temperature within the above range, little to no scum may be generated, pattern shape may not flow down during thermal curing, and the amount of out gas may be decreased. In addition, the thermal acid generator may smooth cross-linking, ring-closure reactions etc. of the polymer and thus can improve reliability such as chemical resistance, heat resistance, insulation properties, and the like.

The thermal acid generator may play a role of smoothing ring-closure reaction of a post-described cross-linking agent and the polymer even at a low temperature as well as catalyze a cross-linking reaction between the cross-linking agent and the polymer. Accordingly, an organic film generating out gas in a small amount despite baking at a low temperature and having excellent heat and chemical resistance may be obtained.

The thermal acid generator may be, for example a compound represented by Chemical Formula 36, Chemical Formula 37, or a combination thereof.

[Chemical Formula 36]
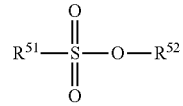

[Chemical Formula 37]
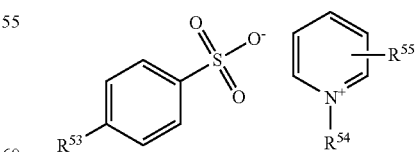

In Chemical Formulae 36 and 37, $R^{51}$ is a hydrogen atom, a substituted or unsubstituted C1 to C30 alkoxy group, a substituted or unsubstituted C6 to C30 aryl group, or a combination thereof, $R^{52}$ is a hydrogen atom, a substituted or unsubstituted C1 to C30 alkyl group, a substituted or unsubstituted C2 to C30 alkenyl group, a substituted or unsubstituted C1 to C30 alkynyl group, or a combination thereof, $R^{53}$ is a hydrogen atom, a substituted or unsubstituted C1 to C30 alkyl group, a substituted or unsubstituted C1 to C30 alkoxy group, or a combination thereof, $R^{54}$ is a hydrogen atom, a substituted or unsubstituted C1 to C30 alkyl group, or a combination thereof, and $R^{55}$ is a hydrogen atom, a halogen atom, a substituted or unsubstituted C1 to C30 alkyl group, or a combination thereof.

Chemical Formula 36 may be represented by one or more selected from Chemical Formulae 36a to 36c.

[Chemical Formula 36a]

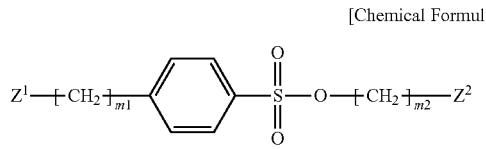

[Chemical Formula 36b]

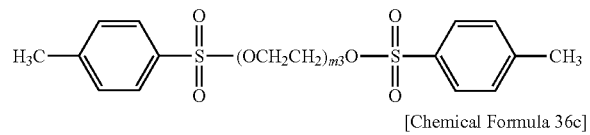

[Chemical Formula 36c]

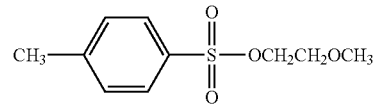

In Chemical Formulae 36a to 36c, m1 to m4 are the same or different and are each independently integers ranging from 0 to 10, for example 0 to 6, and $Z^1$ to $Z^4$ are the same or different and are each independently a hydrogen atom, a halogen atom, a hydroxy group, a substituted or unsubstituted C1 to C30 alkyl group, a substituted or unsubstituted C2 to C30 alkenyl group, a substituted or unsubstituted C2 to C30 alkynyl group, a substituted or unsubstituted C1 to C30 alkoxy group, a substituted or unsubstituted C6 to C30 aryl group, or a combination thereof.

Chemical Formulae 36 and 37 may be represented by one or more of Chemical Formulae 38 to 44.

[Chemical Formula 38]

CH₃—⟨⟩—S(=O)₂—OCH₂CH₂OCH₃

[Chemical Formula 39]

CH₃—⟨⟩—S(=O)₂—O(CH₂)₃CH₃

[Chemical Formula 40]

CH₃—⟨⟩—S(=O)₂—OCH₂C≡CH

[Chemical Formula 41]

CH₃—⟨⟩—S(=O)₂—(OCH₂CH₂)₃O—S(=O)₂—⟨⟩—CH₃

[Chemical Formula 42]

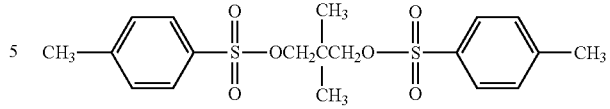

[Chemical Formula 43]

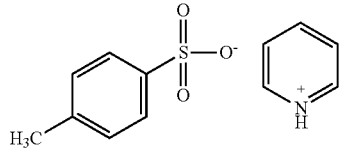

[Chemical Formula 44]

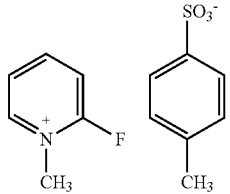

Other examples of a thermal acid generator include one or more of the compounds represented by Chemical Formulae 45 to 48:

[Chemical Formula 45]

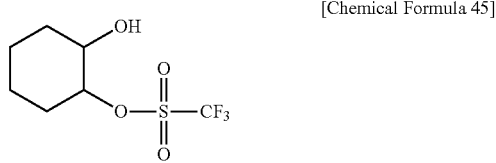

[Chemical Formula 46]

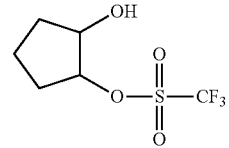

[Chemical Formula 47]

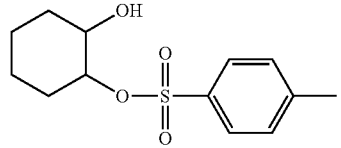

[Chemical Formula 48]

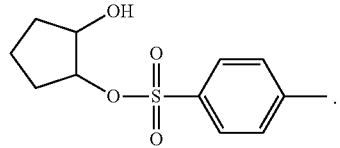

The resin composition can include the thermal acid generator in an amount of about 1 part by weight to about 60 parts by weight, for example about 1 part by weight to about 50 parts by weight, for example about 5 parts by weight to about 40 parts by weight, for example about 5 parts by weight to about 35 parts by weight, based on about 100 parts by weight of the polymer. In some embodiments, the resin composition can include the thermal acid generator in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, or 60 parts by weight. Further, according to some embodiments of the present invention, the amount of the thermal acid generator can be in a range from about any of the foregoing amounts to about any other of the foregoing amounts.

When the thermal acid generator is included in an amount within the above range, a ring closure reaction of the polymer may be sufficiently performed and thus thermal and mechanical characteristics and also excellent storage stability and sensitivity can be improved.

The thermal acid generator may be selected depending on a curing temperature and used as one kind alone or a mixture of more than two.

Other non-limiting examples of the thermal acid generator can include allylsulfonic acids such as p-toluene sulfonic acid and/or benzenesulfonic acid, perfluoroalkyl sulfonic acids such as trifluoromethanesulfonic acid and/or fluorobutanesulfonic acid, and alkyl sulfonic acids such as methane sulfonic acid, ethane sulfonic acid, and/or butane sulfonic acid.

Cross-Linking Agent

The resin composition may further include a cross-linking agent.

Examples of the cross-linking agent may include without limitation one or more selected from Chemical Formulae 5 to 7:

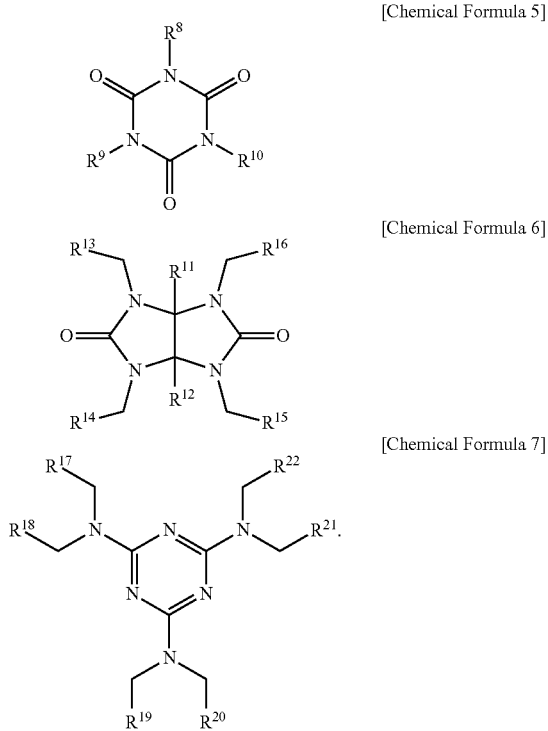

[Chemical Formula 5]

[Chemical Formula 6]

[Chemical Formula 7]

In Chemical Formulae 5 to 7, $R^8$ to $R^{10}$ are the same or different and are each independently a hydrogen atom, a substituted or unsubstituted C1 to C10 alkyl group or a substituted or unsubstituted C1 to C10 alkoxy group, $R^{11}$ and $R^{12}$ are the same or different and are each independently a hydrogen atom or a substituted or unsubstituted C1 to C10 alkyl group, and $R^{13}$ to $R^{22}$ the same or different and are each are independently a hydrogen atom, a hydroxy group, a substituted or unsubstituted C1 to C10 alkyl group, or a substituted or unsubstituted C1 to C10 alkoxy group.

For example, $R^{13}$ to $R^{22}$ may be independently a C1 to C10 alkyl group substituted with a C1 to C5 alkoxy group. Herein, the cross-linking agent may react with the polymer more smoothly to more easily form a cross-linking structure.

The cross-linking agent plays a role of preventing a taper angle from being smaller, after the resin composition according to one embodiment is cured. Furthermore, the resin composition can further include the above thermal acid generator as well as the cross-linking agent, which reacts with the polymer and forms the cross-linking structure during the baking of the organic film (resin film) after forming a pattern, and herein, the thermal acid generator promotes formation of the cross-linking structure of the cross-linking agent. Accordingly, the resin composition may be cured at a low temperature of less than or equal to about 300° C. and may be more actively cross-linked, which can increase heat resistance and chemical resistance of the baked organic film (resin film). In addition, the organic film can generate less out-gas after the heating and baking and thus generation of a dark spot can be suppressed. Furthermore, the organic film may have a reduced shrinkage rate after the curing.

In exemplary embodiments, in Chemical Formulae 5 to 7, $R^8$ to $R^{10}$ are the same or different and are each independently a hydrogen atom, a C1 to C10 alkyl group substituted with a hydroxy group, or a substituted or unsubstituted C1 to C10 alkoxy group, $R^{11}$ and $R^{12}$ are the same or different and are each independently a hydrogen atom or a substituted or unsubstituted C1 to C10 alkyl group, and $R^{13}$ to $R^{22}$ are the same or different and are each independently a hydrogen atom, a hydroxy group, a C1 to C10 alkyl group substituted with a hydroxy group, or a substituted or unsubstituted C1 to C10 alkoxy group.

The resin composition can include the cross-linking agent in an amount of about 1 part by weight to about 60 parts by weight, for example about 1 part by weight to about 50 parts by weight, for example about 1 part by weight to about 45 parts by weight, for example about 5 parts by weight to about 40 parts by weight, based on about 100 parts by weight of the polymer. In some embodiments, the resin composition can include the cross-linking agent in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, or 60 parts by weight. Further, according to some embodiments of the present invention, the amount of the cross-linking agent can be in a range from about any of the foregoing amounts to about any other of the foregoing amounts.

When the cross-linking agent is used in an amount within the above range, excellent heat resistance and chemical resistance may be provided and out gas may be controlled.

(F) Black Pigment

A resin composition according to one embodiment includes a black pigment.

When the resin composition according to one embodiment includes the black pigment, a light-blocking film made using the resin composition may be provided.

Example of the black pigment may include without limitation inorganic black pigments, organic black pigments, and combinations thereof, for example, an aniline black, a perylene black, a titanium black, a cyanine black, a lignin black, a lactam-based organic black, a RGB black, a carbon black, and the like, and combinations thereof. In exemplary embodiments, the black pigment may include an inorganic black pigment and/or an organic black pigment, the inorganic black pigment may be carbon black, and the organic black pigment may be a lactam-based organic black represented by the following Chemical Formula A:

[Chemical Formula A]

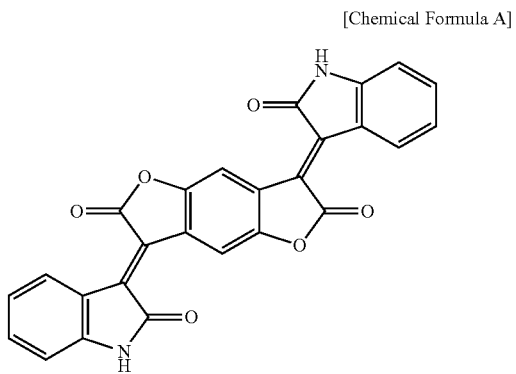 [SMILES: O=C1Nc2ccccc2/C1=C1\C(=O)Oc2cc3c(cc21)OC(=O)/C3=C1/C(=O)Nc2ccccc21]

The RGB black indicates a pigment showing black by mixing at least two color pigments selected from a red pigment, a green pigment, a blue pigment, a violet pigment, a yellow pigment, a purple pigment, and the like.

When the black pigment includes carbon black, light-blocking property, surface smoothness, dispersion stability, and the like can be excellent. On the other hand, the black pigment may be used with a color calibrator such as an anthraquinone-based pigment, a perylene-based pigment, a phthalocyanine-based pigment, an azo-based pigment, and the like.

A dispersing agent may be used together with the pigment in order to improve dispersion of the pigment. For example, the pigment may be surface-pretreated with a dispersing agent, or the pigment and dispersing agent may be added together during preparation of the resin composition.

The dispersing agent may be a non-ionic dispersing agent, an anionic dispersing agent, a cationic dispersing agent, and the like. Examples of the dispersing agent may include without limitation polyalkylene glycols and esters thereof, polyoxyalkylenes, polyhydric alcohol ester alkylene oxide addition products, alcohol alkylene oxide addition products, sulfonate esters, sulfonate salts, carboxylate esters, carboxylate salts, alkylamide alkylene oxide addition products, alkyl amines, and the like, and may be used singularly or as a mixture of two or more.

Commercially available examples of the dispersing agent may include without limitation DISPERBYK-101, DISPERBYK-130, DISPERBYK-140, DISPERBYK-160, DISPERBYK-161, DISPERBYK-162, DISPERBYK-163, DISPERBYK-164, DISPERBYK-165, DISPERBYK-166, DISPERBYK-170, DISPERBYK-171, DISPERBYK-182, DISPERBYK-2000, DISPERBYK-2001, and the like made by BYK Co., Ltd.; EFKA-47, EFKA-47EA, EFKA-48, EFKA-49, EFKA-100, EFKA-400, EFKA-450, and the like made by EFKA Chemicals Co.; Solsperse 5000, Solsperse 12000, Solsperse 13240, Solsperse 13940, Solsperse 17000, Solsperse 20000, Solsperse 24000GR, Solsperse 27000, Solsperse 28000, and the like made by Zeneka Co.; and/or PB711, PB821, and the like made by Ajinomoto Inc.

The resin composition may include the dispersing agent in an amount of about 0.1 to about 15 wt % based on the total weight (100 wt %) of the resin composition. When the dispersing agent is included in an amount within the above range, the resin composition can have excellent dispersion property and thus, may form an organic film having excellent stability, developability, and pattern-forming capability.

The pigment may be pre-treated using a water-soluble inorganic salt and a wetting agent. When the pigment is pre-treated, a primary particle of the pigment may become finer.

The pre-treatment may be performed by kneading the pigment with a water-soluble inorganic salt and a wetting agent and then, filtering and washing the kneaded pigment.

The kneading may be performed at a temperature ranging from about 40° C. to about 100° C., and the filtering and washing may be performed by filtering the pigment after washing away an inorganic salt with water and the like.

Examples of the water-soluble inorganic salt may include without limitation sodium chloride, potassium chloride, and the like, and combinations thereof. The wetting agent may allow the pigment to be uniformly mixed with the water-soluble inorganic salt uniformly and be pulverized. Examples of the wetting agent include without limitation alkylene glycol monoalkyl ethers such as ethylene glycol monoethylether, propylene glycol monomethylether, diethylene glycol monomethylether, and the like, and alcohols such as ethanol, isopropanol, butanol, hexanol, cyclohexanol, ethylene glycol, diethylene glycol, polyethylene glycol, glycerine polyethylene glycol, and the like. These may be used singularly or as a mixture of two or more.

The pigment may be used in a pigment dispersion liquid including the dispersing agent and an organic solvent (such as one or more of the organic solvents discussed herein), and the pigment dispersion liquid may include a solid pigment, a dispersing agent, and an organic solvent. Herein, the solid pigment may be included in an amount of about 8 wt % to about 12 wt % based on the total amount (total weight, 100 wt %) of the pigment dispersion liquid.

The resin composition may include the pigment dispersion liquid in an amount of about 5 wt % to about 70 wt %, for example about 5 wt % to about 60 wt %, for example about 5 wt % to about 55 wt %, based on the total amount (total weight, 100 wt %) of the resin composition. When the pigment dispersion liquid is included in an amount within the above range, resolution and pattern linearity can be improved.

(G) Other Additive(s)

The resin composition according to one embodiment can include one or more other additives.

Examples of the other additives can include without limitation malonic acid; 3-amino-1,2-propanediol, a leveling agent, a surfactant, a radical polymerization initiator, and the like, and combinations thereof, for example in order to prevent stains and/or spots during coating, to adjust leveling, and/or to prevent residues due to non-development. Amounts of the additive may be adjusted according to desired properties.

The resin composition may further include an epoxy compound to improve close contacting (adhesion) property and the like with a substrate. Examples of the epoxy compound may include without limitation phenol novolac epoxy compounds, tetramethyl biphenyl epoxy compounds, bisphenol A epoxy compounds, alicyclic epoxy compounds, and the like, and combinations thereof.

When the epoxy compound is further included, a radical polymerization initiator such as a peroxide initiator and/or an azobis-based initiator may be further included.

The epoxy compound may be used in an amount of about 0.01 part by weight to about 5 parts by weight based on about 100 parts by weight of the resin composition. When the epoxy compound is included in an amount within the above range, storage capability, close-contacting force, and other characteristics may be improved economically.

In addition, the resin composition may further include an appropriate surfactant and/or a leveling agent in order to prevent stains of a film and developability.

The resin composition may be for example a positive photosensitive resin composition.

A method of forming a pattern using the resin composition, for example a positive photosensitive resin composition, can include coating the resin composition on a support substrate, for example using spin coating, slit coating, inkjet printing, and the like; drying the coated resin composition to form a resin composition film; exposing the resin composition film; developing the exposed resin composition film with an alkali aqueous solution to manufacture an organic film; and heat-treating the organic film. Conditions for forming the pattern are widely known in the art and will not be illustrated in detail in the present specification.

According to one embodiment, an organic film made using the resin composition, for example a positive photosensitive resin composition, is provided.

The organic film may be a photosensitive resin film. For example, the photosensitive resin film may be an insulation layer for an organic light emitting device such as OLED, but is not limited thereto.

The resin composition may be used in the formation of an insulation layer, a passivation layer, and/or a buffer coating layer in a display device. That is, the resin composition may be used for formation of a surface protective layer and/or an interlayer insulating layer in a display device due to improved thermal characteristics and a high refractive index.

Hereinafter, the present invention is illustrated in more detail with reference to the following examples. These examples, however, are not in any sense to be interpreted as limiting the scope of the invention.

EXAMPLES

Preparation of Polymer

Preparation Example 1

0.019 mol of a compound represented by Chemical Formula 1-2 and 0.038 mol of a compound represented by Chemical Formula 12-1 are put in a four-necked flask equipped with a stirrer, a temperature controller, a nitrogen gas injector, and a cooler, while nitrogen is passed therethrough, and propylene glycolmonomethylether (PGME) is used as a solvent in an amount to provide a total solid content of 15 wt %.

The reactor is heated up to 95° C., and 10 wt % of NaOH based on the total amount of the compound represented by Chemical Formula 1-2 and the compound represented by Chemical Formula 12-1 is added thereto. As used herein, the NaOH is a 20% solution. The mixture is stirred for 5 hours, completing a reaction. The resultant is neutralized with HCl at room temperature, the reaction mixture is added to DIW (ten times as many a weight as that of the reaction solution) to produce a precipitate, the precipitate is filtered, sufficiently cleaned with water, and dried at 80° C. under vacuum for 24 hours, preparing a polymer having a weight average molecular weight of 4,500 g/mol. The weight average molecular weight is measured using GPC made by Waters Corp. and a Shodex column made by Showa Denko K.K.

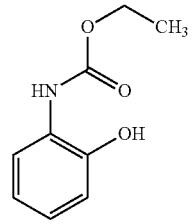

[Chemical Formula 1-1]

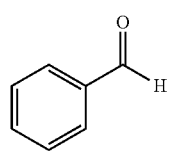

[Chemical Formula 12-1]

HO─(CH$_2$─O)$_3$─H

Preparation Example 2

A polymer having a weight average molecular weight of 4,300 g/mol is prepared according to the same method as Preparation Example 1 except for using a compound represented by Chemical Formula 12-2 instead of the compound represented by Chemical Formula 12-1.

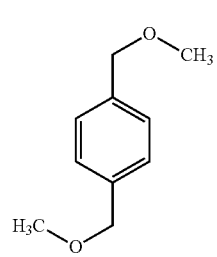

[Chemical Formula 12-2]

Preparation Example 3

A polymer having a weight average molecular weight of 4,800 g/mol is prepared according to the same method as Preparation Example 1 except for using a compound represented by Chemical Formula 12-3 instead of the compound represented by Chemical Formula 12-1.

[Chemical Formula 12-3]

Preparation Example 4

A polymer having a weight average molecular weight of 4,800 g/mol is prepared according to the same method as Preparation Example 1 except for using a compound represented by Chemical Formula 1-2 instead of the compound represented by Chemical Formula 1-1.

[Chemical Formula 1-2]

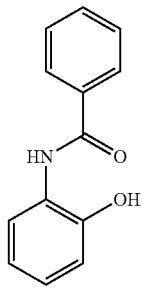

Preparation Example 5

A polymer having a weight average molecular weight of 4,500 g/mol is prepared according to the same method as Preparation Example 4 except for using a compound represented by Chemical Formula 12-2 instead of the compound represented by Chemical Formula 12-1.

Preparation Example 6

A polymer having a weight average molecular weight of 4,600 g/mol is prepared according to the same method as Preparation Example 4 except for using a compound represented by Chemical Formula 12-3 instead of the compound represented by Chemical Formula 12-1.

Preparation of Resin Composition

Example 1

10 g of the polymer according to Preparation Example 1 is mixed with and dissolved in 90 g of a mixed organic solvent (propylene glycolmonomethylether (PGME): gamma-butyrolactone (GBL) in a weight ratio of 90:10), and the solution is filtered with a 0.45 μm fluorine resin filter, obtaining a resin composition (the boiling point of the PGME: 118° C., the boiling point of GBL: 204° C.).

Example 2

A resin composition is prepared according to the same method as Example 1 except for using the polymer according to Preparation Example 2 instead of the polymer according to Preparation Example 1.

Example 3

A resin composition is prepared according to the same method as Example 1 except for using the polymer according to Preparation Example 3 instead of the polymer according to Preparation Example 1.

Example 4

A resin composition is prepared according to the same method as Example 1 except for using the polymer according to Preparation Example 4 instead of the polymer according to Preparation Example 1.

Example 5

A resin composition is prepared according to the same method as Example 1 except for using the polymer according to Preparation Example 5 instead of the polymer according to Preparation Example 1.

Example 6

A resin composition is prepared according to the same method as Example 1 except for using the polymer according to Preparation Example 6 instead of the polymer according to Preparation Example 1.

Example 7

8.3 g of the polymer according to Preparation Example 1 is mixed with and dissolved in 90 g of an organic solvent (PGME:GBL=90:10 of a weight ratio), and 1.7 g of a diazoquinone compound represented by Chemical Formula X is added thereto and dissolved therein. Then, the solution is filtered with a 0.45 μm fluorine resin filter, obtaining a resin composition.

[Chemical Formula X]

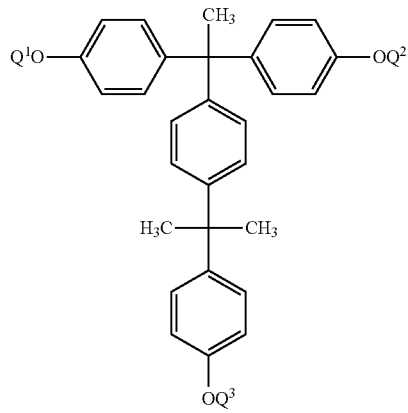

In Chemical Formula X, two of $Q^1$, $Q^2$ and $Q^3$ are represented by

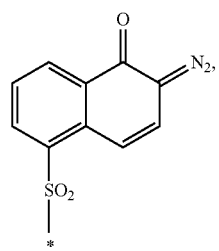

and the other of $Q^1$, $Q^2$ and $Q^3$ is a hydrogen atom.

Example 8

A resin composition is obtained according to the same method as Example 7 except for using the polymer according to Preparation Example 2 instead of the polymer according to Preparation Example 1.

Example 9

A resin composition is obtained according to the same method as Example 7 except for using the polymer according to Preparation Example 3 instead of the polymer according to Preparation Example 1.

Example 10

7.7 g of the polymer according to Preparation Example 4 is mixed with and dissolved in 90 g of an organic solvent (PGME:GBL=90:10 of a weight ratio), and 1.5 g of a diazoquinone compound represented by Chemical Formula X and 0.77 g of a thermal acid generator represented by Chemical Formula 38 are additionally added thereto and dissolved therein. Subsequently, the solution is filtered with a 0.45 µm fluorine resin filter, obtaining a resin composition.

[Chemical Formula X]

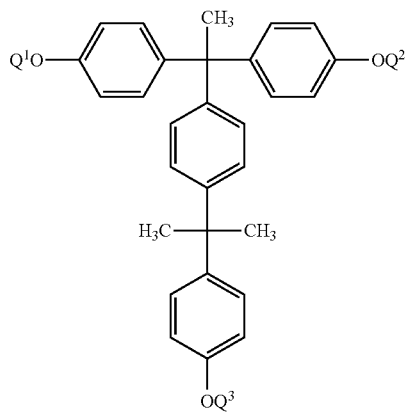

[Chemical Formula 38]

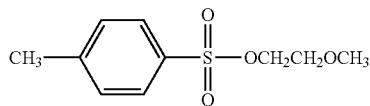

In Chemical Formula X, two of $Q^1$, $Q^2$ and $Q^3$ are represented by

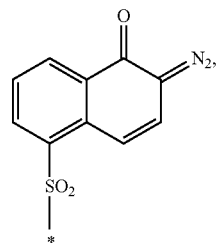

and the other of $Q^1$, $Q^2$ and $Q^3$ is a hydrogen atom.

Example 11

A resin composition is obtained according to the same method as Example 10 except for using the polymer according to Preparation Example 5 instead of the polymer according to Preparation Example 4.

Example 12

A resin composition is obtained according to the same method as Example 10 except for using the polymer according to Preparation Example 6 instead of the polymer according to Preparation Example 4.

Example 13

6.9 g of the polymer according to Preparation Example 4 is mixed with and dissolved in 90 g of an organic solvent (PGME:GBL=90:10 of a weight ratio), and 1.4 g of a diazoquinone compound represented by Chemical Formula X, 0.7 g of a thermal acid generator represented by Chemical Formula 38, and 1.0 g of a cross-linking agent represented by Chemical Formula 7-1 are additionally added thereto and dissolved therein. Then, the solution is filtered with a 0.45 µm fluorine resin filter, obtaining a resin composition.

[Chemical Formula X]

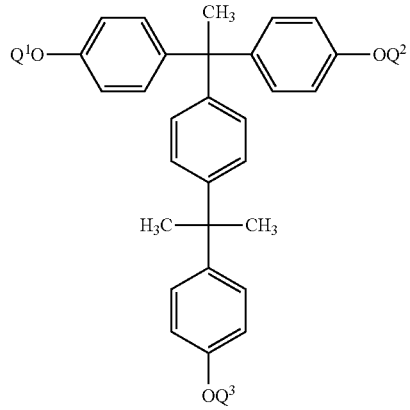

[Chemical Formula 38]

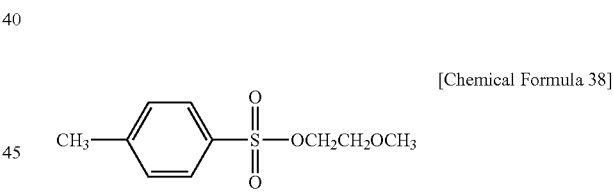

[Chemical Formula 7-1]

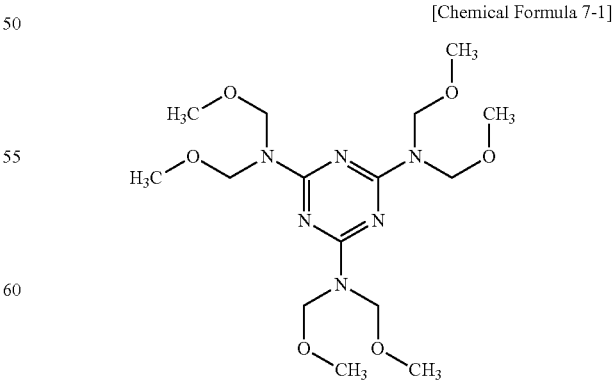

In Chemical Formula X, two of $Q^1$, $Q^2$ and $Q^3$ are represented by

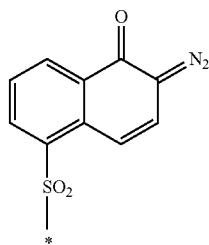

and the other of $Q^1$, $Q^2$ and $Q^3$ is a hydrogen atom.

Example 14

A resin composition is obtained according to the same method as Example 13 except for using a cross-linking agent represented by Chemical Formula 6-1 instead of the cross-linking agent represented by Chemical Formula 9-1.

[Chemical Formula 6-1]

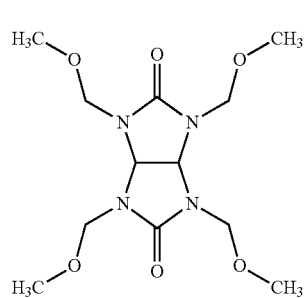

Example 15

3.5 g of the polymer according to Preparation Example 4 is mixed with and dissolved in 78 g of an organic solvent (PGME:GBL=90:10 of a weight ratio), and 1 g of a photoacid generator represented by Chemical Formula 10-2, 1 g of a cross-linking agent represented by Chemical Formula 5-1, 0.4 g of a thermal acid generator represented by Chemical Formula 38, and 17 g of carbon black (a solid of 24%, Tokushiki Co., Ltd.) are additionally added thereto and dissolved therein. Subsequently, the solution is filtered with a 0.45 μm fluorine resin filter, obtaining a resin composition.

[Chemical Formula 10-2]

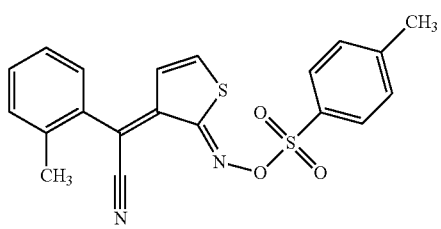

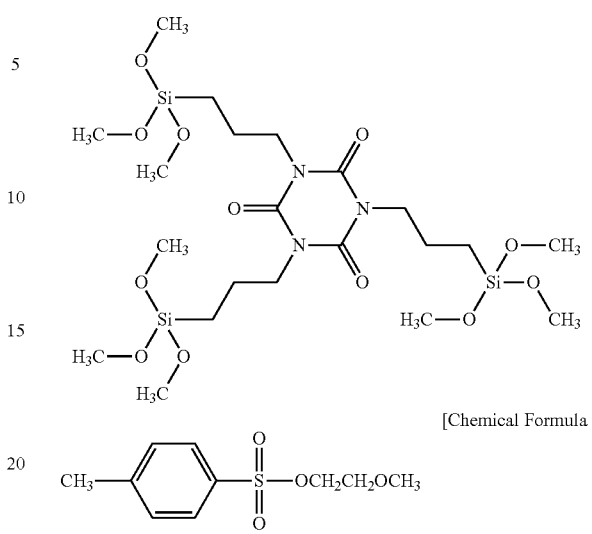

Comparative Example 1

A resin composition is obtained according to the same method as Example 1 except for using a novolac resin having a weight average molecular weight of 5,100 g/mol (m/p=6/4; KCR-6300, Kangnam Chemical Co., Ltd.) instead of the polymer according to Preparation Example 1.

Comparative Example 2

A resin composition is prepared according to the same method as Example 7 except for using the novolac resin according to Comparative Example 1 instead of the polymer according to Preparation Example 1.

(Evaluation)

Evaluation 1: Measurement of 1 wt % Loss Temperature

Each resin composition according to Examples 1 to 6 and Comparative Example 1 is coated on an 8-inch wafer with a spin-coater (K-SPINNER, SEMES Co., Ltd.) and heated on a 110° C. hot plate for 1 minute to form a film. The film is cured at 250° C. under a nitrogen atmosphere for one hour. After the curing, the film is scratched with a double razor blade, made into a pellet, and heated up to 600° C. by 10° C. per a minute, and then, the wt % loss of the film is measured by using a discovery equipment made by TA instruments. Herein, each sample is loaded in a weight range of 5 mg to 10 mg, and the weight loss of the sample depending on a temperature is measured based on 100 wt % of its initial weight. Then, a temperature that the sample lost 1 wt % of a weight is recorded, and the results are provided in Table 1 and FIG. 1.

TABLE 1

|  | 1 wt % loss temperature (° C.) |
| --- | --- |
| Example 1 | 255 |
| Example 2 | 260 |
| Example 3 | 270 |
| Example 4 | 290 |
| Example 5 | 300 |
| Example 6 | 305 |
| Comparative Example 1 | 140 |

Evaluation 2: Sensitivity Measurement

Each resin composition according to Examples 7 to 14 and Comparative Example 2 is coated on an 8-inch wafer with a spin-coater (K-SPINNER, SEMES Co., Ltd.) and heated on a 100° C. hot plate for 1 minute, forming a 1 µm-thick resist film. The wafer coated with the resist film is exposed to light by using a mask having variously-sized patterns and changing a light dose with NSR i-10C made by Nikon Co., developed with a 2.38% TMAH solution for 60 seconds at room temperature to dissolve an exposed region, and washed with pure water for 30 seconds to form a pattern. Then, sensitivity is evaluated by measuring energy for realizing a 5 µm hole with a reference to a 5 µm hole pattern size measured with S-9260 made by Hitachi Ltd., and the sensitivity results are provided in Table 2.

In addition, the resin composition according to Example 15 is separately coated on a 0.5 mm-thick bare glass (10 cm*10 cm) with a spin-coater (1H-DX2, MIKASA) and heated on a 100° C. hot plate for 1 minute, forming a 1.5 µm-thick resist film. The glass coated with the resist film is exposed to light by using a mask having variously-sized patterns and changing a light dose with UX-12005M-AKS03 made by Ushio inc, developed with a 0.045% KOH solution at room temperature for 90 seconds to remove a non-exposed region, and washed with pure water for 30 seconds, forming a pattern. Herein, sensitivity is obtained by measuring energy for realizing a 10 µm line with a reference to a 10 µm line pattern size by using a DP72 made by Olympus Co., and the sensitivity results are provided in Table 2.

Evaluation 3: Measurement of Taper Angle

The wafer and glass used in Evaluation 2 are cured at 250° C. for 1 hour under a nitrogen atmosphere, their taper angles are measured by S-4300 (FE-SEM equipment) made by Hitachi Ltd., and the results are provided in Table 2.

TABLE 2

|  | Sensitivity (mJ/cm$^2$) | Taper angle (°) |
| --- | --- | --- |
| Example 7 | 130 | 35 |
| Example 8 | 145 | 40 |
| Example 9 | 140 | 45 |
| Example 10 | 140 | 45 |
| Example 11 | 145 | 48 |
| Example 12 | 140 | 45 |
| Example 13 | 130 | 50 |
| Example 14 | 140 | 52 |
| Example 15 | 140 | 52 |
| Comparative Example 2 | 150 | 30 |

As shown in Tables 1 and 2 and FIG. 1, the resin composition including the polymer including the repeating unit represented by Chemical Formula 1 according to one embodiment show excellent sensitivity and taper characteristics as well as excellent thermal characteristics compared with a composition not including the polymer.

Many modifications and other embodiments of the invention will come to mind to one skilled in the art to which this invention pertains having the benefit of the teachings presented in the foregoing description. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation, the scope of the invention being defined in the claims.

What is claimed is:

1. A resin composition comprising:
a polymer including a repeating unit represented by Chemical Formula 1, a cross-linking agent, and a solvent:

[Chemical Formula 1]

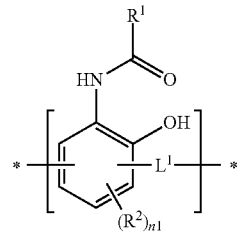

wherein, in Chemical Formula 1,
$R^1$ is a substituted or unsubstituted C1 to C20 alkoxy group, a substituted or unsubstituted C3 to C20 cycloalkyl group, a substituted or unsubstituted C6 to C20 aryl group or a substituted or unsubstituted C2 to C20 heteroaryl group,
$R^2$ is a halogen atom, a hydroxy group, an amino group, a nitro group, a substituted or unsubstituted C1 to C20 alkyl group, or a substituted or unsubstituted C6 to C20 aryl group,
$L^1$ is a single bond, a substituted or unsubstituted C1 to C20 alkylene group, a substituted or unsubstituted C6 to C20 arylene group, a substituted or unsubstituted C2 to C20 heteroarylene group, or a combination thereof, and
n1 is an integer ranging from 0 to 2,
wherein the cross-linking agent is represented by Chemical Formula 5:

[Chemical Formula 5]

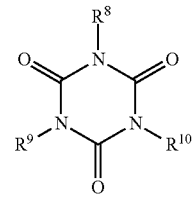

wherein in Chemical Formula 5,
$R^8$ to $R^{10}$ are the same or different and are each independently a hydrogen atom, a C1 to C10 alkyl group substituted with a hydroxy group, or a substituted or unsubstituted C1 to C10 alkoxy group, wherein at least one of $R^8$ to $R^{10}$ is an unsubstituted C1 to C10 alkoxy group.

2. The resin composition of claim 1, wherein the $L^1$ is selected from one of Chemical Formulae 2 to 4:

[Chemical Formula 2]

[Chemical Formula 3]

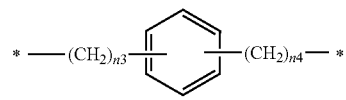

[Chemical Formula 4]

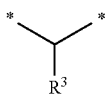

wherein, in Chemical Formulae 2 to 4, n2 is an integer ranging from 1 to 10, n3 and n4 are the same or different and are each independently integers ranging from 1 to 7, and $R^3$ is a substituted or unsubstituted C3 to C20 cycloalkyl group or a substituted or unsubstituted C6 to C20 aryl group.

3. The resin composition of claim 1, wherein the solvent comprises two or more organic solvents having different boiling points.

4. The resin composition of claim 1, comprising the solvent in an amount of about 130 parts by weight to about 2,000 parts by weight based on about 100 parts by weight of the polymer.

5. The resin composition of claim 1, wherein the resin composition further comprises a diazoquinone compound, a thermal acid generator, a photoacid generator, or a combination thereof.

6. The resin composition of claim 1, comprising the cross-linking agent in an amount of about 1 part by weight to about 60 parts by weight based on about 100 parts by weight of the polymer.

7. The resin composition of claim 1, wherein the resin composition further comprises a black pigment.

8. The resin composition of claim 7, wherein the black pigment comprises an aniline black, a perylene black, a titanium black, a cyanine black, a lignin black, a lactam-based organic black, a RGB black, a carbon black, or a combination thereof.

9. The resin composition of claim 1, wherein the resin composition further comprises an additive comprising malonic acid, 3-amino-1,2-propanediol, a leveling agent, a surfactant, a radical polymerization initiator, or a combination thereof.

10. An organic film manufactured using the resin composition of claim 1.

* * * * *